US011705903B2

(12) United States Patent
Rousson et al.

(10) Patent No.: US 11,705,903 B2
(45) Date of Patent: Jul. 18, 2023

(54) BACK-GATE BIASING OF CLOCK TREES USING A REFERENCE GENERATOR

(71) Applicant: Rambus Inc., San Jose, CA (US)

(72) Inventors: Alain Rousson, East York (CA); Hui Song, Toronto (CA); Ravi Shivnaraine, Toronto (CA); Christopher Holdenried, Toronto (CA); Hector Villacorta, Aguascalientes (MX)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/526,830

(22) Filed: Nov. 15, 2021

(65) Prior Publication Data

US 2022/0158637 A1 May 19, 2022

Related U.S. Application Data

(60) Provisional application No. 63/114,466, filed on Nov. 16, 2020.

(51) Int. Cl.
*H03K 19/003* (2006.01)
*H03K 19/00* (2006.01)
*H03K 19/0185* (2006.01)

(52) U.S. Cl.
CPC ... *H03K 19/0027* (2013.01); *H03K 19/01855* (2013.01); *H03K 19/018521* (2013.01)

(58) Field of Classification Search
CPC ....... H03K 19/0027; H03K 19/018521; H03K 19/01855
See application file for complete search history.

(56) References Cited

U.S. PATENT DOCUMENTS

| | | | | |
|---|---|---|---|---|
| 5,461,338 A * | 10/1995 | Hirayama | ............... | G05F 3/205 327/544 |
| 5,917,365 A * | 6/1999 | Houston | ............ | H03K 19/0016 327/537 |
| 6,232,793 B1 * | 5/2001 | Arimoto | ............ | H01L 27/0218 326/98 |
| 6,333,571 B1 * | 12/2001 | Teraoka | ............ | H03K 19/0013 307/115 |
| 6,373,321 B1 * | 4/2002 | Yamauchi | ........... | H01L 27/0218 327/537 |
| 6,847,252 B1 * | 1/2005 | Ono | ................. | H03K 19/00384 327/537 |
| 7,355,437 B2 * | 4/2008 | Perisetty | .......... | H03K 19/00315 326/14 |

(Continued)

OTHER PUBLICATIONS

Di Mauro, Alfio et al., "Performance-Aware Predictive-Model-Based On-Chip Body-Bias Regulation Strategy for an ULP Multi-Core Closter in 28nm UTBB FD-SOI". 2020. Integr. VLSI J. 72, C (May 2020), 194-207. DOI:https://doi.org/10.1016/j.vlsi.2019.12.006, 15 pages.

(Continued)

*Primary Examiner* — Kurtis R Bahr
(74) *Attorney, Agent, or Firm* — Lowenstein Sandler LLP

(57) ABSTRACT

The embodiments herein describe technologies for back-gate biasing of clock trees using a reference generator. A circuit includes a set of clock buffers and a programmable voltage reference generator to apply a voltage to a back gate of a transistor of the set of clock buffers.

24 Claims, 8 Drawing Sheets

(56) References Cited

U.S. PATENT DOCUMENTS

| | | | |
|---|---|---|---|
| 7,973,557 B2* | 7/2011 | Bittiestone | H03K 19/1778 |
| | | | 326/38 |
| 9,264,045 B2* | 2/2016 | Vashishtha | H03K 19/0027 |
| 9,479,168 B2 | 10/2016 | Giraud et al. | |
| 9,762,245 B1 | 9/2017 | Otto et al. | |
| 2004/0104760 A1* | 6/2004 | Ando | H03K 19/0027 |
| | | | 327/534 |

OTHER PUBLICATIONS

Huard, Vincent, "FDSOI Technology and Dynamic BB Compensation, Enabling next-gen AI/IoT products—An industrial perspective", Dolphin Integrations, IRPS19, 2019, 51 pages.

Zimmer, Brian et al., "A RISC-V Vector Processor With Simultaneous-Switching Switched-Capacitor DC-DC Converters in 28 nm FDSOI", IEEE Journal of Solid-State Circuits, vol. 51, No. 4, Apr. 2016, pp. 930-942, 13 pages.

Zimmer, Brian et al., "A Risc-V Vector Processor with Tightly-Integrated Switched-Capacitor DC-DC Converters in 28nm FDSOI", IEEE, 2015 Symposium on VLSI Circuits Digest of Technical Papers 23-2, 978-4-86348-502-0, 2015, pp. C316-C317, 2 pages.

* cited by examiner

BACK-GATE BIASING OF CLOCK TREES USING A REFERENCE GENERATOR

RELATED APPLICATION

This application claims the benefit of U.S. Provisional Application No. 63/114,466, filed Nov. 16, 2020, the entire content of which is hereby incorporated by reference herein.

BACKGROUND

High-speed clock distribution trees are a large power contributor in high-speed interfaces. A clock tree is one or more clock circuits that form a clock distribution network used in circuit designs. A clock tree can include clocking circuitry and/or clocking devices between a clock source and a destination of a clock signal. A clock tree can be used to cascade and synthesize multiple output clocks to one or more devices. A trunk of a clock tree can refer to a reference clock and branches of a clock tree can refer to the various output clocks. A clock source can be a crystal, a crystal oscillator, a voltage controlled oscillator, a clock generator, or the like. A clock buffer can be a portion of a clock tree that is used to create a copy or a derivative of a reference clock.

BRIEF DESCRIPTION OF THE DRAWINGS

The present disclosure is illustrated by way of example, and not by way of limitation, in the figures of the accompanying drawings.

DETAILED DESCRIPTION

As described above, high-speed clock distribution trees are a large power contributor in high-speed interfaces. The embodiments herein describe technologies for back-gate biasing of clock trees using a reference generator. The embodiments described herein are directed to technologies for adding a small reference generator locally to clock distribution trees to drive a back gate of a buffer, which leads to low area and low power, as compared to other approaches. High-speed Fully Depleted Silicon On Insulator (FD-SOI) transistors, which use flip-well construction, can be used for these high-speed clock distribution trees. One approach for biasing a back gate of a FD-SOI transistor uses fully inverted wells for the chain of transistors. This approach can result in a lower area by having some transistors share a common well, but has higher power when biasing. Another approach for biasing a back gate of a FD-SOI transistor use a front-back gate connection. This approach can result in lower power than the other approach, but has a higher area as each of the transistors have their own corresponding well. As described above, a clock tree can include a series of clock buffers, each buffer including a transistor pair, and can be used to form a clock distribution network for one or more circuits that use one or more clock signals. In some cases, a clock tree has a chain of clock buffers, each including a complementary transistor pair. In at least one embodiment, a circuit includes a set of clock buffers and a programmable voltage reference generator that applies a voltage to a back gate of a transistor of the set of clock buffers. A back gate can also be referred to as a well body bias voltage terminal. FD-SOI technology allows for control of a threshold voltage ($V_{TH}$) via back-gate biasing. Local reference generation permits speed and power optimization for individual clock trees by adjusting the threshold voltage ($V_{TH}$) via the back-gate.

Figure 1A:
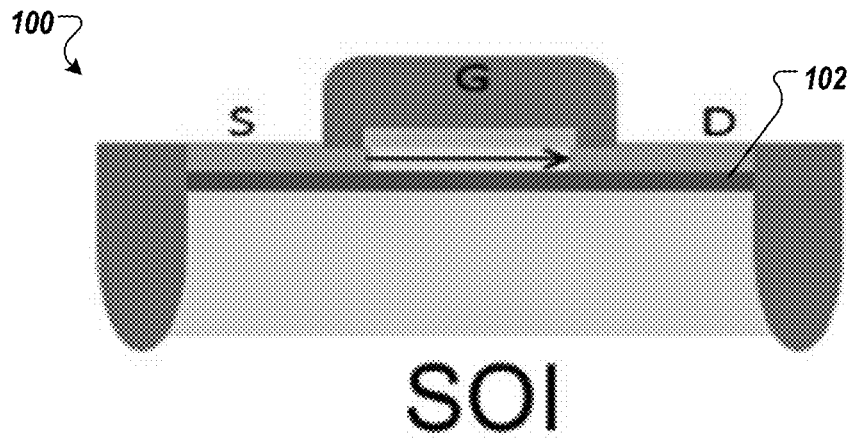
FIG. 1A is a cross-sectional view of a SOI transistor according to one implementation.
Figure 1B:
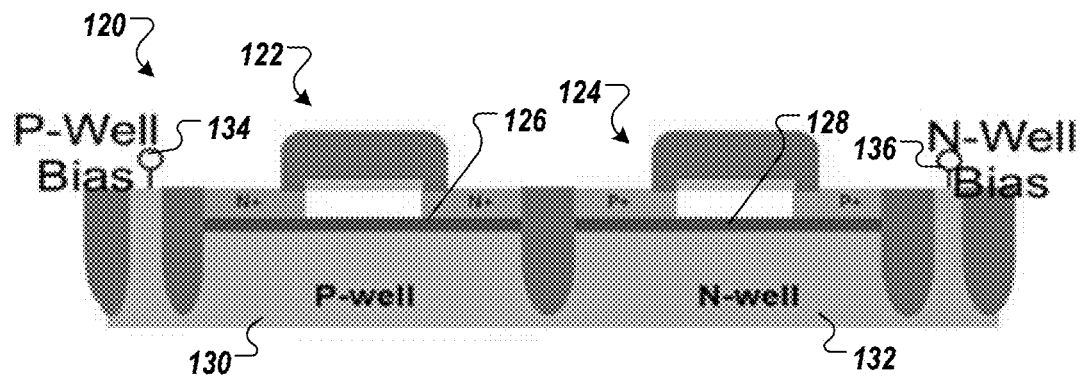
FIG. 1B is a cross-sectional view of a transistor pair with normal wells below insulator buried oxide (BOX) regions according to one implementation.
Figure 1C:
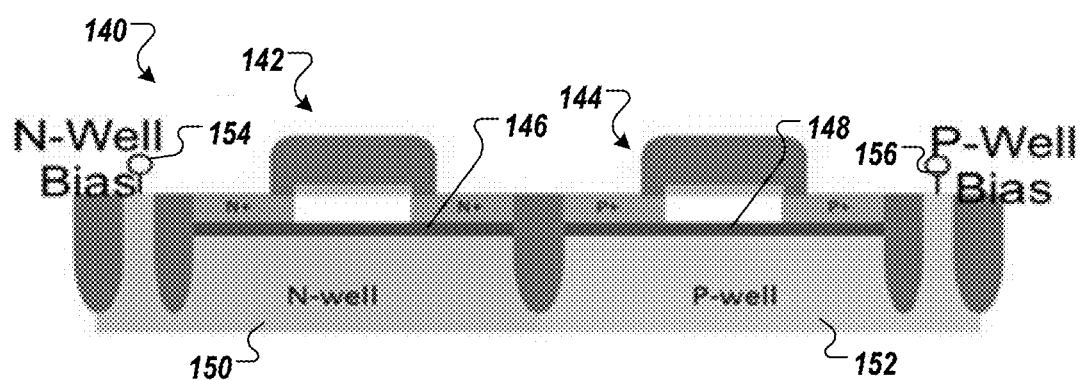
FIG. 1C is a cross-sectional view of a transistor pair with reversed wells below insulator BOX regions according to one implementation.
Figure 2:
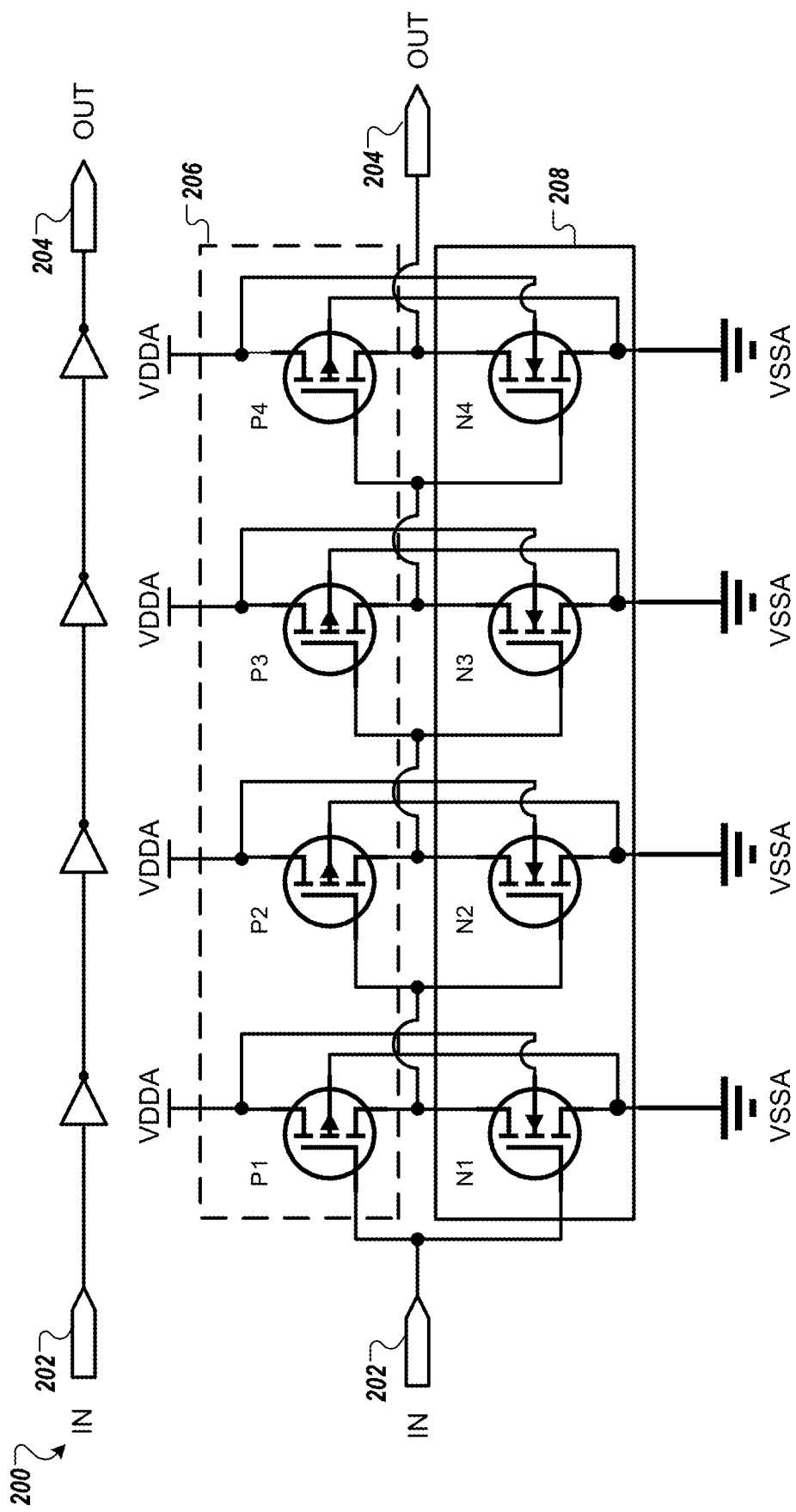
FIG. 2 is a schematic diagram of a set of clock buffers implemented with four transistor pairs that are fully inverted according to one implementation.
Figure 3:
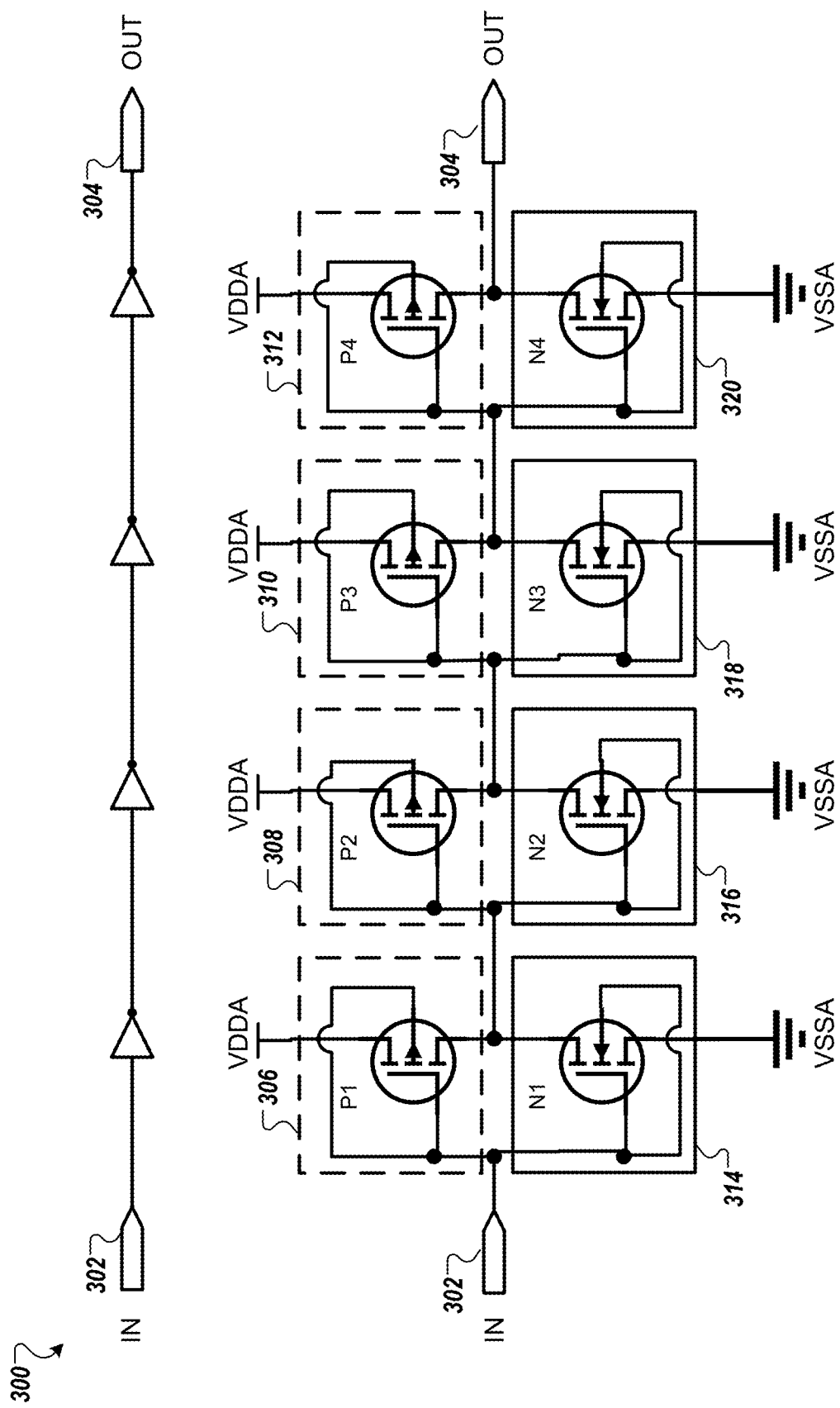
FIG. 3 is a schematic diagram of a set of clock buffers implemented with four transistor pairs with front-back gate connections according to one implementation.

To facilitate understanding of using FD-SOI technology to control a threshold voltage ($V_{TH}$) via back-gate biasing, the following description with respect to FIGS. 1A-1C provides some details regarding SOI transistors and transistor pairs and the following description with respect to FIGS. 2-3 provides some details regarding other approaches to back-gate biasing FD-SOI transistors.

FIG. 1A is a cross-sectional view of a SOI transistor 100 according to one implementation. SOI transistor 100 includes a thin insulating layer of BOX between a channel and a well, which isolates the channel from the well. Complementary metal oxide semiconductor (CMOS) technology uses both NMOS and PMOS transistors that are arranged in a structure formed by two complementary networks. A transistor pair can be organized as a normal SOI transistor pair or a flip well SOI transistor pair, as illustrated in FIGS. 1B and 1C, respectively.

FIG. 1B is a cross-sectional view of a transistor pair 120 with normal wells below insulator BOX regions according to one implementation. Transistor pair 120 includes an N-type transistor 122 (NMOS) and a P-type transistor 124 (PMOS). The N-type transistor 122 is disposed above a first insulator BOX region 126 and the P-type transistor 124 is disposed above a second insulator BOX region 128. The BOX layer may be carved into individual regions such that the MOS transistors are disposed on individual regions of the BOX layer. These regions are referred to herein as insulator BOX regions. The first insulator BOX region 126 is disposed above a P-well 130 and the second insulator BOX region 128 is disposed above an N-well 132. A first well body bias voltage terminal 1343 is coupled to the P-well 130 and a second well body bias voltage terminal 136 is coupled to the N-well 132. The P-well 130 can be seated above the N-well 132 and the N-well 132 can be disposed above a P-substrate (not illustrated in FIG. 1B). The N-type transistor 122 and the P-type transistor 124 are considered normal wells. The N-type transistor 122 is normal well because it is in P-well 130, which is possible because of the first insulator BOX region 126. Similarly, the P-type transistor 124 is considered "normal well" because it is in the N-well 132, which is possible because of the second insulator BOX region 128. The normal wells below the insulator BOX regions allow the first well body bias voltage ($V_{BN}$) and the second well body bias voltage ($V_{BP}$) to act as back gates. In the N-type transistor 122, for example, if the back gate voltage is driven to a positive voltage above the source, the back gate voltage aids the regulator poly gate by increasing the current as if it were reducing a magnitude of a first threshold voltage ($V_{TN}$) of the N-type transistor 122. However, this would forward bias the PN junction between the body bias and the source, disrupting normal operation of the transistor and is not done in practice. Similarly for the P-type transistor 124, if the back gate is driven to a negative voltage below the source, the current is added as if a second threshold voltage ($V_{TP}$) of the P-type transistor 124 is reduced in magnitude. However, this would forward bias the PN junction between the body bias and the source, disrupting normal operation of the transistor and is not done in practice. By changing the back gate voltage, the direct current (DC) bias condition in the transistors is changed. The extended threshold voltage ranges can be used for controlling the threshold voltage via the back gates. The transistor pair 120 can be fabricated using FD-SOI technology. In some cases, the bulk can be flipped for a transistor pair with flip well, as illustrated in FIG. 1C. The flip well can be driven to manipulate the threshold voltages of the transistors.

FIG. 1C is a cross-sectional view of a transistor pair 140 with reversed wells (also referred to as flip wells) below insulator BOX regions according to one implementation. The transistor pair 140 includes an N-type transistor 142 (NMOS) and a P-type transistor 144 (PMOS). The N-type transistor 142 is disposed above a first insulator BOX region 146 of a BOX layer and the P-type transistor 144 is disposed above a second insulator BOX region 148 of the BOX layer. The first insulator BOX region 146 is disposed above an N-well 150 and the second insulator BOX region 148 is disposed above a P-well 152. A first well body bias voltage terminal 154 is coupled to the N-well 150 and a second well body bias voltage terminal 156 is coupled to the P-well 152. The P-well 152 can be seated above the N-well 150 and the N-well 150 can be disposed above a P-substrate (not illustrated in FIG. 1C). The N-type transistor 142 and P-type transistor 144 are considered reversed wells or flip wells. The N-type transistor 142 is considered to be "reversed well" because it is in the N-well 150, which is possible because of the first insulator BOX region 146. Similarly, the P-type transistor 144 is reversed well because it is in a P-well 152, which is possible because of the second insulator BOX region 148. The reversed wells below the insulator BOX regions allow the first well body bias voltage ($V_{BN}$) and the second well body bias voltage ($V_{BP}$) to generate extended threshold voltage ranges for a first threshold voltage ($V_{TN}$) of the N-type transistor 142 and a second threshold voltage ($V_{TP}$) of the P-type transistor 144 without forward biasing the PN junction between the body bias and source, since that junction no longer exists. The extended threshold voltage ranges can be used for controlling the threshold voltage via the back gates.

In one approach, when using multiple transistor pairs in a high-speed clock tree, the wells of the transistors pairs can be fully inverted and all PMOS transistors can sit in a first well and all NMOS transistors can set in a second well. In particular, each back gate of each of the PMOS transistors is coupled to each source of the NMOS transistors and each back gate of each of the NMOs transistors is coupled to each source of the PMOS transistors. Because multiple PMOS transistors can all be in the same first well and multiple NMOS transistors can be in the same second well, the fully inverted wells can have a low area for implementing the high-speed clock tree. The threshold voltage ($V_{TH}$), however, is so low that active and leakage power is 2.5× a traditionally connected CMOS well. An example of multiple transistors pairs in a set of clock buffers is illustrated and described below with respect to FIG. 2.

FIG. 2 is a schematic diagram of a set of clock buffers 200 implemented with four transistor pairs that are fully inverted according to one implementation. Set of clock buffers 200 includes four inverters between an input terminal 202 and an output terminal 204. The back gates of PMOS transistors are coupled to a lower voltage potential (VSSA) (e.g., ground) and the back gates of NMOS transistors are coupled to a higher voltage potential (VDDA). Since each of the back gates of the PMOS transistors are coupled to the same lower voltage potential, VSSA, the four PMOS transistors can be implemented in a same first well 206. Since each of the back gates of the NMOS transistors are coupled to the same higher voltage potential, VDDA, the four NMOS transistors can be implemented in a same second well 208. With this configuration, all MOS transistors (also referred as MOS devices) of a given type can sit in a combined well, resulting in a lowest area. However, the large negative voltage between source and body bias ($V_{SB}$) lowers $V_{TH}$ to a small value, leading to very high active and leakage power.

In one approach, when using multiple transistor pairs in a high-speed clock tree, the transistors can have front-back gate connections for back-gate biasing. In particular, each transistor's back gate is coupled to the respective transistor's front gate. Connecting the front and back gates together is optimal for power, but has a higher area for implementation. An example of multiple transistor pairs with front-back gate connections in a set of clock buffers is and described below with respect to FIG. 3.

FIG. 3 is a schematic diagram of a set of clock buffers 300 implemented with four transistor pairs with front-back gate connections according to one implementation. Set of clock buffers 300 includes four inverters between an input terminal 302 and an output terminal 304. The back gates of PMOS transistors are coupled to the front gates of the PMOS transistors and the back gates of NMOS transistors are coupled to the front gates of the NMOS transistors. Since each of the back gates of the PMOS transistors are coupled to each of the front gates of the PMOS transistors, the four PMOS transistors cannot be implemented in the same first well. Rather, a first PMOS transistor is located in a first well 306 and a second PMOS transistor is located in a separate second well 308. Similarly, a third PMOS transistor is located in a separate third well 310 and a fourth PMOS transistor is located in a separate fourth well 312. In addition, since each of the back gates of the NMOS transistors are coupled to each of the front gates of the NMOS transistors, the four NMOS transistors cannot be implemented in the same second well. Rather, a first NMOS transistor is located in a first well 314 and a second NMOS transistor is located in a separate second well 316. Similarly, a third NMOS transistor is located in a separate third well 318 and a fourth NMOS transistor is located in a separate fourth well 320. When a given transistor is on, $V_{SB}$ is large and negative, lowering $V_{TH}$. When the transistor is off, $V_{SB}$=0V, increases $V_{TH}$. This approach is low power, but the drawback is that each transistor must have its own well, leading to very high area.

Aspects of the present disclosure overcome the deficiencies and drawbacks of the implementations described above by providing a reference generator locally to drive back gates of a set of clock buffers, allowing lower power and lower area. The back gate voltages can be biased for controlling the threshold voltages for clock buffers in high-speed clock distribution networks as described in more detail below. The reference generator can be instantiated multiple times. In some embodiments, the reference generator(s) can be implemented to have a same track height as the clock buffers used in a clock tree to that it can be easily integrated with custom CMOS logic. In some embodiments, the reference generator(s) can be programmable. A programmable reference generator can be combined with a process monitor to change $V_{SB}$ with process. For example, the current can be increased for slow-slow (SS) parts and decreased for fast-fast (FF) parts using the programmable reference generator and process monitor.

Figure 4:
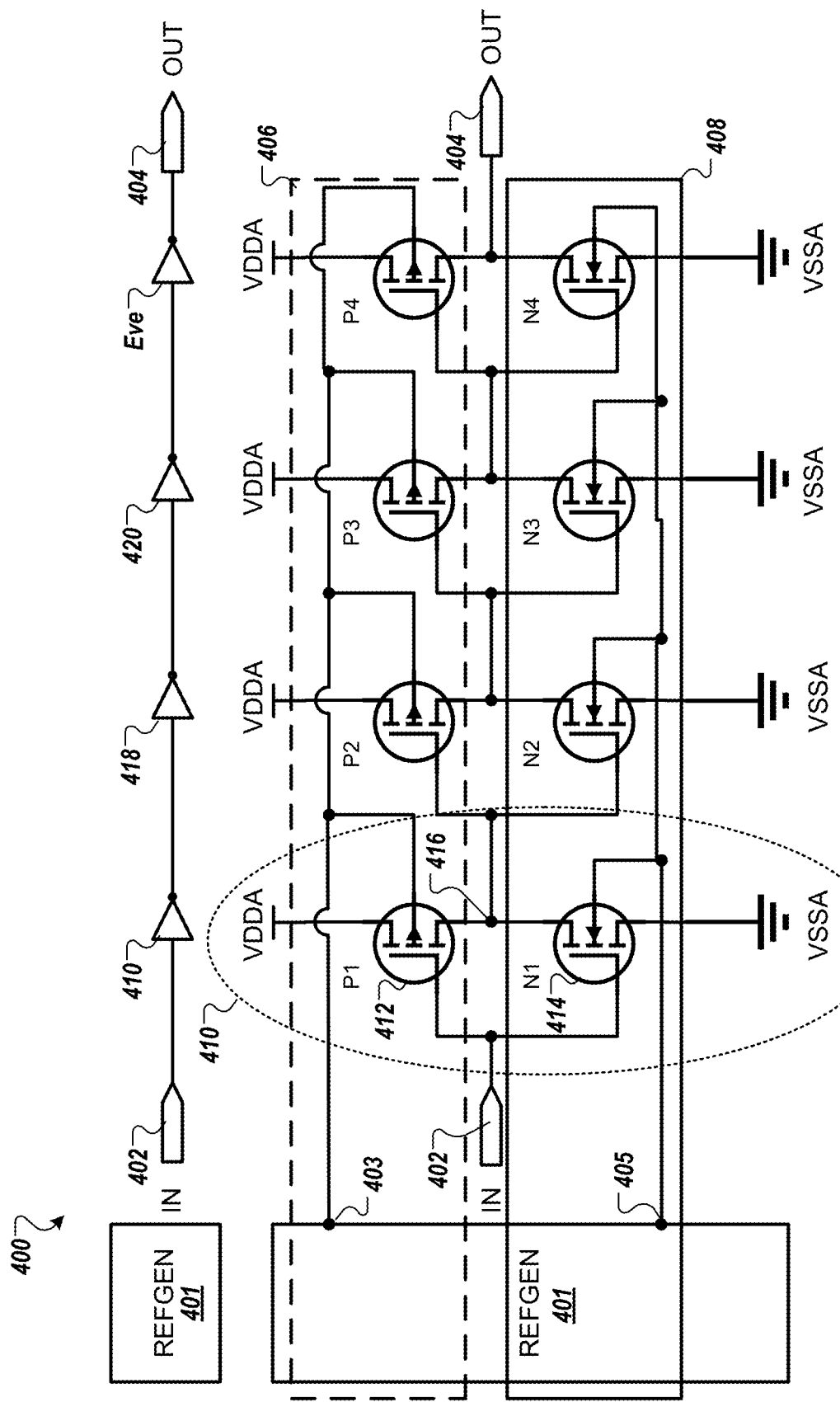
FIG. 4 is a schematic diagram of a set of clock buffers implemented with four transistor pairs with back gates coupled to a reference generator according to at least one embodiment.

FIG. 4 is a schematic diagram of a set of clock buffers 400 implemented with four transistor pairs with back gates coupled to a reference generator 401 according to at least one embodiment. Set of clock buffers 400 includes four inverters between an input terminal 402 and an output terminal 404. The four inverters can be implemented with a series or chain of complementary transistor pairs. The back gates of PMOS transistors are coupled to a first terminal 403 of reference generator 401. The back gates of PMOS transistors can be biased by a signal (e.g., a voltage) from reference generator 401. Since each of the back gates of the PMOS transistors are coupled to the same first terminal 403, the four PMOS transistors can be implemented in a same first well 406. The back gates of NMOS transistors are coupled to a second terminal 405 of reference generator 401. Since each of the back gates of the NMOS transistors are coupled to the same second terminal 405, the four NMOS transistors can be implemented in a same second well 408. It should be noted that an area penalty is incurred by adding reference generator 401, but each stage (e.g., buffer) of the set of clock buffers 400 can share a well, resulting in similar areas as the set of clock buffers 200. Coupling the back gates to reference generator 401 results in similar power as the set of clock buffers 300. As such, by coupling the back gates to reference generator 401, threshold voltage ($V_{TH}$) for the PMOS transistors can be chosen to achieve required speed with little margin, minimizing active and leakage current to achieve the minimal performance. Similarly, threshold voltage ($V_{TH}$) for the NMOS transistors can be chosen to achieve required speed with little margin, minimizing active and leakage current to achieve the minimal performance. As illustrated in FIG. 4, reference generator 401 provides a first bias signal to the back gates of the PMOS transistors on first terminal 403 and provides a second bias signal to the back gates of the NMOS transistors on second terminal 405. The first bias signal and the second bias signal can be used to control the threshold voltages of transistors for optimizing power and minimizing area of implementation of a clock tree.

In at least one embodiment, reference generator 401 is integrated alongside the set of clock buffers 400. In at least one embodiment, reference generator 401 is formed in a same well or wells as the transistors. For example, a portion of reference generator 401 pertaining to the PMOS transistors can be formed in the same first well 406 as the PMOS transistors and a portion of reference generator 401 pertaining to the NMOS transistors can be formed in the same second well 408 as the NMOS transistors. In at least one embodiment, reference generator 401 is designed to have a same track height as the set of clock buffers 400, regardless of whether formed in the same well as the respective transistors.

In at least one embodiment, a first clock buffer 410 of the set of clock buffers 400 includes a first complementary transistor pair coupled between a higher voltage potential (VDDA) and a lower voltage potential (VSSA) (e.g., ground potential). The first complementary transistor pair includes a first PMOS transistor 412 and a first NMOS transistor 414. Front gates of first PMOS transistor 412 and first NMOS transistor 414 are coupled to input terminal 402. A back gate of first PMOS transistor 412 is coupled to first terminal 403 of reference generator 401. A back gate of first NMOS transistor 414 is coupled to second terminal 405 of reference generator 401. A signal, at input terminal 402, is inverted by the first complementary transistor pair and output at an output node 416. Output node 416 is coupled to front gates of a second complementary transistor pair, corresponding to a second clock buffer 418. Back gates of the second complementary transistor pair are also coupled to first terminal 403 and second terminal 405, respectively, in a similar manner as back gates of the first complementary transistor pair. Similarly, front gates of complementary transistor pairs for clock buffers 420 and 422 are coupled to first terminal 403 and second terminal 405. The set of clock buffers output a clock signal on output terminal 404. Although FIG. 4 illustrates four clock buffers in a series or chain, in other embodiments, other numbers of clock buffers can be used. An even number of clock buffers in a clock tree outputs a clock signal on output terminal 404 that is a same sign convention as an input signal on input terminal 402. An odd number of clock buffers in a clock tree outputs a clock signal on output terminal 404 that is a different sign convention as an input signal on input terminal 402.

In at least one embodiment, the first complementary transistor pair (and the other complementary transistor pairs) can be adjusted by a first magnitude of a first well body bias voltage applied to one or more of the back gates of the first complementary transistor pair. In other embodiments, reference generator 401 can generates different well body bias voltages for different transistors, but the transistors may not share a common well. For example, a second magnitude of a second well body bias voltage can be applied to a second complementary transistor pair. It should be noted that the well body bias voltages applied to the back gates can be different voltages for the PMOS transistor and the NMOS transistor. That is, reference generator 401 can control the individual threshold voltages of each transistor in the transistor pair.

In one embodiment, the magnitudes of one or more of the well body bias voltages or the magnitude of a current source can be adjusted to control threshold voltages of the transistors in the clock tree. The threshold voltages can be adjusted over different conditions, such as environmental conditions, local conditions, manufacturing variations, or the like. For example, the threshold voltages can be adjusted over a temperature range or to compensate for process variations.

Referring back to FIG. 4, the first complementary transistor pair of the first clock buffer 410 includes a first PMOS transistor 412 and a first NMOS transistor 414. The first PMOS transistor 412 has a gate terminal coupled to the input terminal 402, a drain terminal coupled to an output node 416, and a source terminal coupled to a first source node that is coupled to a rail voltage (VDDA). The first NMOS transistor 414 has a gate terminal coupled to the input terminal 402, a drain terminal coupled to the output node 416, and a source terminal coupled to a second source node that is coupled to a second rail voltage (VSSA), such as a ground rail. The second complementary transistor pair of the second clock buffer 418 includes a second N-type transistor and a second P-type transistor that are arranged in a similar manner as the first complementary transistor pair, but having an input coupled to the output node 416 of the first complementary transistor pair. Similarly, the third complementary transistor pair of the third clock buffer 420 has an input coupled to an output node of the second complementary transistor pair and the fourth complementary transistor pair has an input coupled to an output of the third complementary transistor pair. An output of the fourth complementary transistor pair is coupled to output terminal 404. The back gates of the P-type transistors are coupled to first terminal 403 of reference generator 401 and the back gates of the N-type transistors are coupled to second terminal 405 of reference generator 401. As described herein, the P-type transistors can be implemented in a first common well and the N-type transistors can be implemented in a second common well. In a further embodiment, each transistor in the complementary transistor pairs is disposed on an insulator BOX region of an insulator BOX layer. In one embodiment, the complementary transistor pairs are fabricated using SOI technology. In another embodiment, the complementary transistor pairs are fabricated using FD-SOI technology. By changing the back gate voltage, the DC bias condition in the transistors is changed. The back gate voltages can be used for controlling the threshold voltages for various conditions as described herein.

In at least one embodiment, the set of clock buffers 400 and reference generator 401 can be used in a clock tree. In other embodiments, separate reference generators can be used for the PMOS transistors and the NMOS transistors, such as illustrated in FIG. 5.

Figure 5:
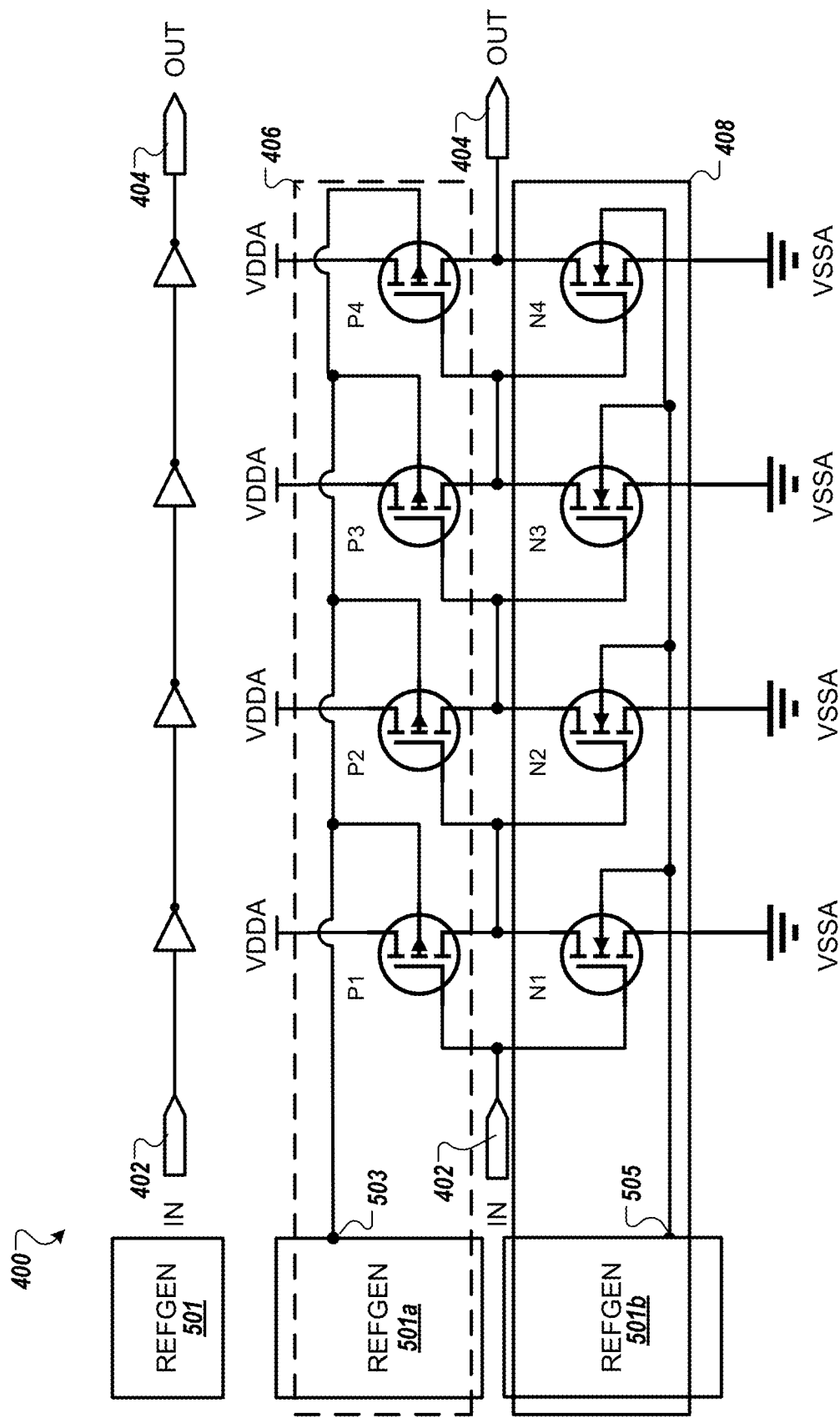
FIG. 5 is a schematic diagram of a set of clock buffers coupled to a first reference generator and a second reference generator according to at least one embodiment.

FIG. 5 is a schematic diagram of the set of clock buffers 400 coupled to a first reference generator 501a and a second reference generator 501b according to at least one embodiment. Set of clock buffers 400 of FIG. 5 are similar to set of clock buffers 400 of FIG. 4, except the back gates of PMOS transistors are coupled to a terminal 503 of first reference generator 501a and back gates of NMOS transistors are coupled to a terminal 505 of second reference generator 501b. Reference generators 501a, 501b can be separate circuits that collectively operate in a similar manner to reference generator 401 described above. Alternatively, reference generators 501a, 501b can be separate portions of a single reference generator 501 with two separate voltage outputs for separately controlling PMOS transistors and NMOS transistors.

As illustrated in FIG. 5, first reference generator 501a provides a first bias signal to the back gates of the PMOS transistors on terminal 503 and second reference generator 501b provides a second bias signal to the back gates of the NMOS transistors on terminal 505. In some embodiments, reference generators 501a, 501b are integrated alongside the set of clock buffers 400. In some embodiments, reference generators 501a, 501b are designed to have a same track height as the set of clock buffers 400. The set of clock buffers 400 and reference generators 501a, 501b can be used in a clock tree.

In at least one embodiment, reference generators 501a, 501b are integrated alongside the set of clock buffers 400 using CMOS logic. In at least one embodiment, first reference generator 501a is formed in the same first well 406 as PMOS transistors and reference generator 501b is formed in the same second well 408 as NMOS transistors. In at least one embodiment, first reference generator 501a is designed to have a same track height as the set of clock buffers 400, regardless of whether formed in the same well as the respective transistors. Similarly, second reference generator 501b is designed to have a same track height as the set of clock buffers 400, regardless of whether formed in the same well as the respective transistors. The set of clock buffers 400 and reference generator 501 (reference generators 501a, 501b) can be used in a clock tree.

In one embodiment, a set of transistors, such as FD-SOI transistors, can be used in clock trees and each of the set of transistors includes a back gate that can be controlled by an adjustable reference generator to tune a threshold voltage ($V_{TH}$) of the set of transistors used in the clock trees. The adjustable reference generator can reduce power consumed by the clock trees. Using the adjustable reference generator, the set of transistors can be implemented in an area that is similar to transistors in a fully inverted well approach as described herein. In other embodiments, a programmable reference generator can be used to adjust a threshold voltage threshold voltage ($V_{TH}$) of the set of transistors used in one or more clock trees. In one embodiment, the programmable reference generator can be used in combination with a performance monitor and feedback circuit to optimize power for local conditions. As described herein, in one embodiment, the programmable reference generator can be used in connection with a process monitor. An example of a programmable reference generator is illustrated and described below with respect to FIG. 6.

Figure 6:
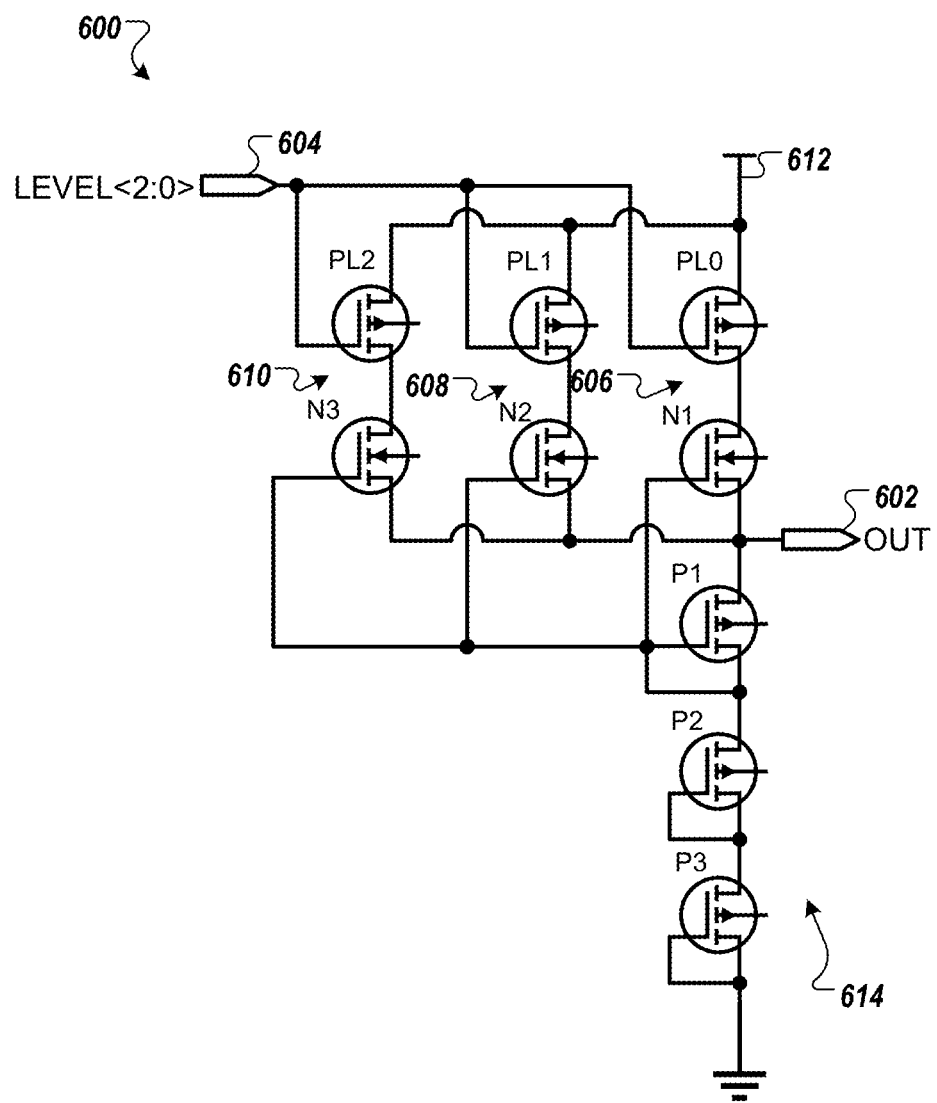
FIG. 6 is a schematic diagram of a programmable reference generator according to at least one embodiment.

FIG. 6 is a schematic diagram of a programmable reference generator 600 according to at least one embodiment. Programmable reference generator 600 is a MOS-only reference generator that generates a programmable analog output signal 602 based on a digital input signal 604. Digital input signal 604 can be multiple bits stored in a register. As illustrated in FIG. 6, digital input signal 604 includes three bits, each bit controlling one of three complementary transistor pairs 606, 608, 610. In particular, a first bit of digital input signal 604 is coupled to a front gate of a first PMOS transistor of first complementary transistor pair 606, a second bit of digital input signal 604 is coupled to a front gate of a second PMOS transistor of second complementary transistor pair 608, and a third bit of digital input signal 604 is coupled to a front gate of a third PMOS transistor of third complementary transistor pair 610. Each of the complementary transistor pairs is coupled between a voltage source 612 and an output terminal at which the programmable analog output signal 602 is output from the programmable reference generator 600. Programmable reference generator 600 also include a set of PMOS transistors coupled in series between the output terminal and a ground potential. Programmable reference generator 600 outputs the programmable analog output signal 602 based which combination of the three complementary transistors pairs 606, 608, 610 are turned on by the corresponding bits of the digital input signal 604. Although FIG. 6 illustrates three branches of complimentary transistors pairs that can be turned on by the digital input signal 604, in other embodiments, other numbers of multiple branches and other numbers of bits of digital values can be used to provide a programmable analog output signal 602. Although FIG. 6 illustrates a MOS-only reference generator, in other embodiments, other arrangement of transistors or other devices can be used to produce an analog output signal based on a digital input signal. In another embodiment, a reference signal is generated with a bias current over a resistor, such as an on-chip resistor.

In at least one embodiment, a circuit includes a set of clock buffers and a programmable voltage reference generator 600 that applies a voltage to a back gate of the transistors in the set of clock buffers. In at least one embodiment, a circuit includes a cluster of clock buffers and a programmable voltage reference generator 600 that applies a voltage to a back gate of the transistors in the cluster. In a further embodiment, the cluster of clock buffers and programmable voltage reference generator 600 are formed in a same well. In another embodiment, the cluster of clock buffers and two programmable voltage reference generators are formed in a same two wells of the complementary transistor pairs.

As described herein, a programmable reference generator, such as programmable reference generator 600 of FIG. 6 can be used with a process monitor to change $V_{TH}$ based on local hardware conditions via feedback to improve performance, power, or both. An example of a programmable reference generator and a process monitor is illustrated and described below with respect to FIG. 7.

Figure 7:
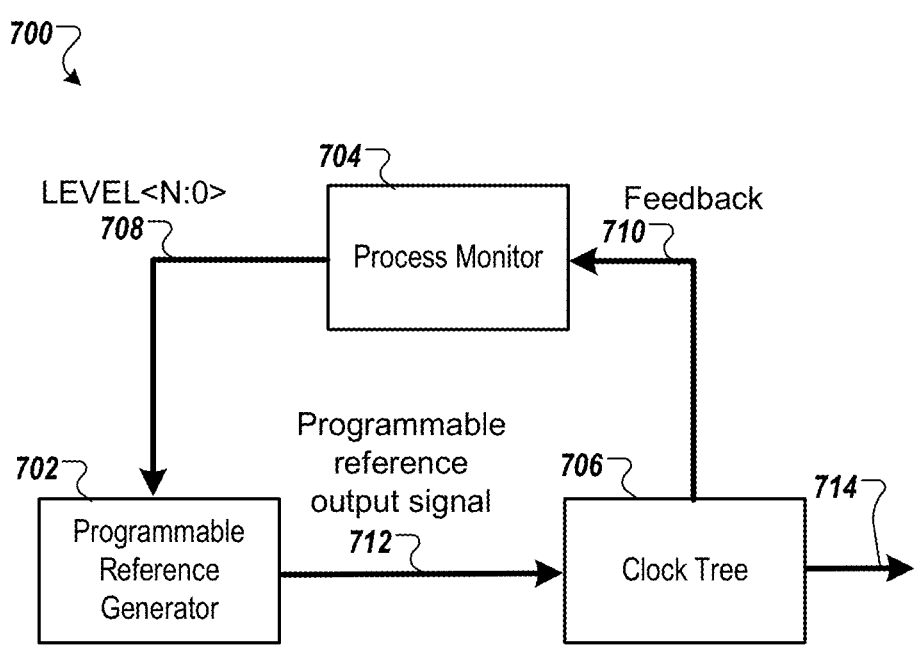
FIG. 7 is a block diagram of a circuit with a programmable reference generator and a process monitor to monitor and change a threshold voltage of one or more transistors of a clock tree according to at least one embodiment.

FIG. 7 is a block diagram of a circuit 700 with a programmable reference generator 702 and a process monitor 704 to monitor and change a threshold voltage of one or more transistors of a clock tree 706 according to at least one embodiment. Clock tree 706 can include a set of one or more transistors, such as in the set of clock buffers 400 illustrated and described above with respect to FIGS. 4-5. Each of the set of transistors can include a back gate and one or more of these back gates can be controlled by programmable reference generator 702. Programmable reference generator 702 can be reference generator 401 of FIG. 4, reference generator 501, or reference generators 501a, 501b of FIG. 5. Programmable reference generator 702 can be programmable reference generator 600 of FIG. 6. Alternatively, programmable reference generator 702 can include other circuitry to control back gates of one or more transistors of clock tree 706.

During operation, programmable reference generator 702 can receive an input signal 708 from process monitor 704. Process monitor 704 can be circuitry that is configured to monitor performance, power, or other local hardware conditions of clock tree 706. Based on feedback 710 from clock tree 706, process monitor 704 can determine how to adjust the programmable reference generator 702 to improve performance, power, or both. For example, process monitor 704 can output a digital input signal, such as a multi-bit value with N bits, where N is a positive integer greater than 1. The multi-bit value can control a programmable reference output signal 712, which is used to control a voltage to one or more back gates of one or more transistors in clock tree 706 as described herein. Clock tree 706 generates an output clock signal 714 that can be used by other circuitry. In another embodiment, based on a signal or information from process monitor 704, programmable reference generator 702 can determine how to adjust threshold voltages of the transistors to improve performance, power, or both.

In at least one embodiment, clock tree 706 includes a set of clock buffers and programmable reference generator 702 that applies a voltage to a back gate of one or more transistors in the set of clock buffers. The set of clock buffers and the programmable voltage generator can be formed in a same well. In at least one embodiment, the set of clock buffers includes a first complementary transistor pair coupled between a first source node and a second source node, the first source node being coupled to a rail voltage and the second source node being coupled to a ground potential. The first complementary transistor pair includes a first input terminal, a first output terminal, a first body well voltage terminal coupled to the reference generator, and a second body well voltage terminal coupled to the reference generator. The set of clock buffers also includes a second complementary transistor pair coupled between the first source node and the second source node. The second complementary transistor pair includes a second input terminal coupled to the first output terminal, a second output terminal, a third body well voltage terminal coupled to the reference generator, and a fourth body well voltage terminal coupled to the reference generator.

In at least one embodiment, the set of clock buffers of clock tree 706 includes a first transistor (e.g., 412) with a front gate terminal coupled to an input node (e.g., 402), a source terminal coupled to a first source node (e.g., VDDA), a drain terminal coupled to an output node (e.g., 416), and a back gate terminal coupled to the reference generator (e.g., 401). In at least one embodiment, the set of clock buffers includes a first transistor (e.g., 412) and a second transistor (e.g., 412). The first transistor (e.g., 412) includes a front gate terminal coupled to an input node (e.g., 402), a source terminal coupled to a first source node (VDDA), a drain terminal coupled to an output node (e.g., 416), and a back gate terminal coupled to a first terminal (e.g., 403, 503) of the reference generator (e.g., 401, 501a). The second transistor includes a front gate terminal coupled to the input node (e.g., 402), a source terminal coupled to a second source node (VSSA), a drain terminal coupled to the output node (e.g., 416), and a back gate terminal coupled to a second terminal (e.g., 405, 505) of the reference generator (e.g., 401, 501b). In some cases, the clock tree 706 can have an even number of clock buffers. In other cases, the clock tree 706 can have an odd number of clock buffers. The clock buffers can be fabricated SOI technology, FD-SOI technology, or the like. In some embodiments, the clock tree 706 and the programmable reference generator 702 are fabricated as having a same track height.

In at least one embodiment, programmable reference generator 702 includes a first portion (e.g., 501a) that is integrated into a same first well (e.g., 406) as a first type of transistors of the set of clock buffers. Back gates of the first type of transistors are coupled to a terminal (e.g., 503) of the first portion of the reference generator. The programmable reference generator 702 also includes a second portion (e.g., 501b) that is integrated into a same second well (e.g., 408) as a second type of transistors of the set of clock buffers. Back gates of the second type of transistors are coupled to a terminal (e.g., 505) of the second portion of the reference generator.

In another embodiment, clock tree 706 is a clock tree circuit that includes a set of clock buffers coupled in series between an input terminal (e.g., 402) and an output terminal (e.g., 404). A first clock buffer (e.g., 410) of the set can include a first transistor (e.g., 412) and a second transistor (e.g., 414). The first transistor includes a first transistor comprising a front gate, coupled to the input terminal, and a back gate. The second transistor includes a front gate, coupled to the input terminal, and a back gate, the first transistor and second transistor being coupled between a first source node (e.g., VDDA) and a second source node (e.g., VSSA) and having a first common output node (e.g., 416). Programmable reference generator 702 outputs a first voltage to the back gate of the first transistor to adjust a first threshold voltage of the first transistor and outputs a second voltage to the back gate of the second transistor to adjust a second threshold voltage of the second transistor. The first transistor can be a P-type transistor and the second transistor is can be N-type transistor. In a further embodiment, clock tree 706 includes a second clock buffer (e.g., 410) having a third transistor and a fourth transistor. The third transistor includes a front gate, coupled to the first common output node, and a back gate. The fourth transistor includes a front gate, coupled to the first common output node, and a back gate, the third transistor and fourth transistor being coupled between the first source node (e.g., VDDA) and the second source node (e.g., VSSA) and having a second common output node. Programmable reference generator 702 outputs the first voltage to the back gate of the third transistor to adjust a third threshold voltage of the third transistor and the second voltage to the back gate of the fourth transistor to adjust a fourth threshold voltage of the second transistor. The third transistor can be a P-type transistor and the fourth transistor can be an N-type transistor. In at least one embodiment, the first transistor and the second transistor reside in a first well (e.g., 406) and the second transistor and the fourth transistor reside in a second well (e.g., 408). In at least one embodiment, a first portion (e.g., 501*a*) of the reference generator resides in the first well (e.g., 406) and a second portion (e.g., 501*b*) of the reference generator resides in the second well (e.g., 408). As described herein, the clock tree 706, including the set of clock buffers, can be fabricated using FD-SOI technology.

In at least one embodiment, process monitor 704 measures a value indicative of a threshold voltage of at least one transistor of the clock tree 706. Programmable reference generator 702 adjusts the threshold voltage of the at least one transistor based on the value by applying a voltage to a back gate of the at least one transistor. Clock tree 706 can include a first complementary transistor pair, including a first transistor (e.g., 412) comprising a front gate, coupled to an input terminal (e.g., 402) of the clock tree, and a back gate and a second transistor (e.g., 414) comprising a front gate, coupled to the input terminal (e.g., 402), and a back gate. The first transistor and second transistor are coupled between a first source node (e.g., VDDA) and a second source node (e.g., VSSA) and have a first common output node (e.g., 416). Programmable reference generator 702 outputs a first voltage to the back gate of the first transistor to adjust a first threshold voltage of the first transistor and a second voltage to the back gate of the second transistor to adjust a second threshold voltage of the second transistor.

In at least one embodiment, clock tree 706 includes a second complementary transistor pair (e.g., 418), including a third transistor comprising a front gate, coupled to the first common output node, and a back gate and a fourth transistor comprising a front gate, coupled to the first common output node, and a back gate. The third transistor and fourth transistor are coupled between the first source node (e.g., VDDA) and the second source node (e.g., VSSA) and have a second common output node. Programmable reference generator 702 outputs the first voltage to the back gate of the third transistor to adjust a third threshold voltage of the third transistor and to output the second voltage to the back gate of the fourth transistor to adjust a fourth threshold voltage of the second transistor. The first transistor can be disposed on a first insulator BOX region of a BOX layer. The second transistor can be disposed on a second insulator BOX region of the BOX layer. The third transistor can be disposed on a third insulator BOX region of the BOX layer. The fourth transistor can be disposed on a fourth insulator BOX region of the BOX layer. The first transistor and the second transistor can reside in a first well (e.g., 406) and the third transistor and the fourth transistor can reside in a second well (e.g., 408). In a further embodiment, a first portion (e.g., 501*a*) of the programmable reference generator 702 resides in the first well (e.g., 406) and a second portion (e.g., 501*b*) of the programmable reference generator 702 resides in the second well (e.g., 408).

Figure 8:
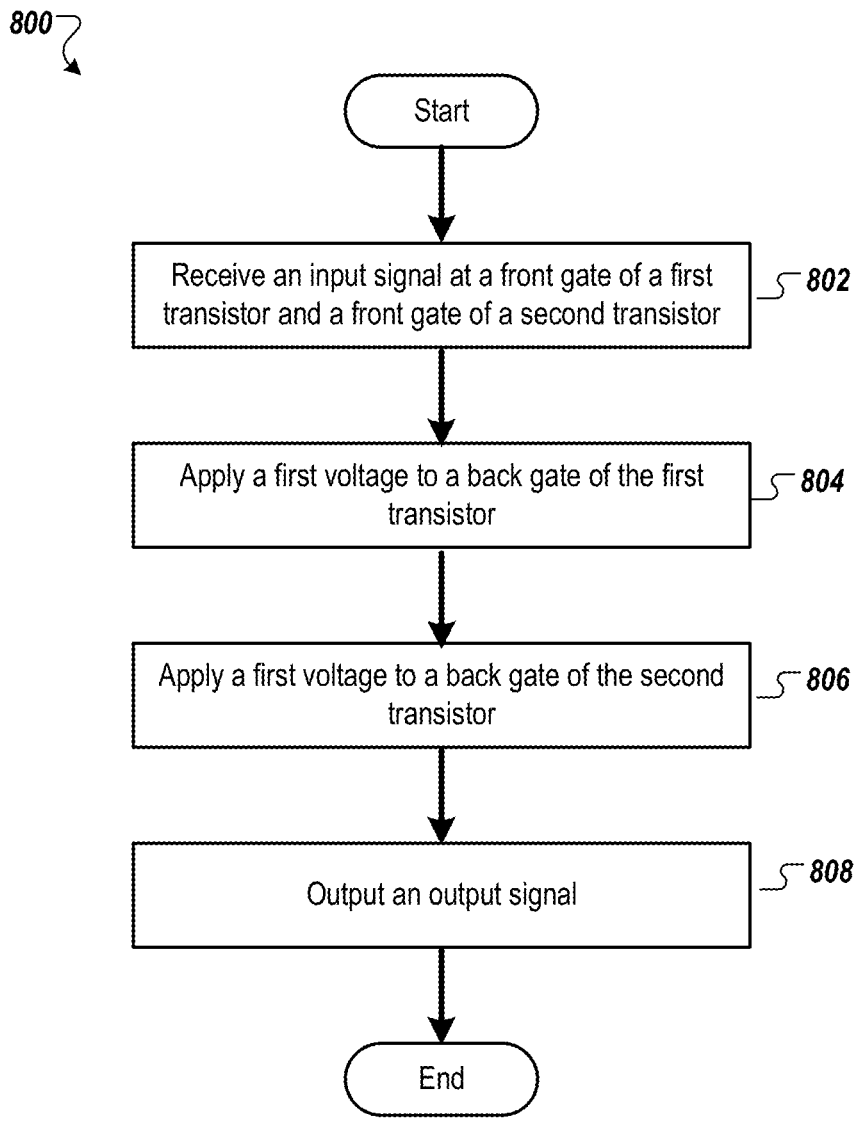
FIG. 8 is a flow diagram of a method of operating a clock tree according to one embodiment.

FIG. 8 is a flow diagram of a method 800 of operating a clock tree according to one embodiment. Method 800 begins by a clock tree receiving an input signal at a front gate of a first transistor and at a front gate of a second transistor (block 802). The first transistor and the second transistor are part of a first complementary transistor pair coupled between a first source node and a second source node and having a first common output node. A reference generator applies a first voltage to a back gate of the first transistor (block 804) and applies a second voltage to a back gate of the second transistor (block 806). A first voltage can be applied to adjust a threshold voltage of the first transistor. A second voltage can be applied to adjust a threshold voltage of the second transistor. The first complementary transistor pair inverts the input signal. Additional stages of complimentary transistor pairs can be used for additional buffer stages of the clock tree. Clock tree outputs an output signal (block 808), and the method 800 ends.

In further embodiments, a clock tree includes one or more additional complementary transistor pairs that are coupled between the first source node and the second source node. Each complimentary transistor pair is coupled to a common output node of the previous complementary transistor pair. In one embodiment, clock tree includes a second complementary transistor pair. In this embodiment, a first signal is received at a front gate of a third transistor and at a front gate of a fourth transistor, the third transistor and the fourth transistor being part of a second complementary transistor pair coupled between the first source node and the second source node and having a second common output node. The reference generator applies the same first voltage to a back gate of the third transistor and applies the same second voltage to a back gate of the fourth transistor. The signals can continue to be inverted at each buffer stage of the clock tree, as described herein.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

The description above includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology, or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A circuit comprising:
   a set of clock buffers; and
   a reference generator to apply a voltage to a back gate of a transistor in the set of clock buffers, wherein the set of clock buffers and the reference generator are formed in a same well.

2. The circuit of claim 1, wherein the set of clock buffers comprises:
   a first complementary transistor pair coupled between a first source node and a second source node, the first source node being coupled to a rail voltage and the second source node being coupled to a ground potential, the first complementary transistor pair comprising a first input terminal, a first output terminal, a first body well voltage terminal coupled to the reference generator, and a second body well voltage terminal coupled to the reference generator; and
   a second complementary transistor pair coupled between the first source node and the second source node, the second complementary transistor pair comprising a second input terminal coupled to the first output terminal, a second output terminal, a third body well voltage terminal coupled to the reference generator, and a fourth body well voltage terminal coupled to the reference generator.

3. The circuit of claim 1, wherein the set of clock buffers comprises a first transistor comprising a front gate terminal coupled to an input node, a source terminal coupled to a first source node, a drain terminal coupled to an output node, and a back gate terminal coupled to the reference generator.

4. The circuit of claim 1, wherein the set of clock buffers comprises:
   a first transistor comprising a front gate terminal coupled to an input node, a source terminal coupled to a first source node, a drain terminal coupled to an output node, and a back gate terminal coupled to a first terminal of the reference generator; and a second transistor comprising a front gate terminal coupled to the input node, a source terminal coupled to a second source node, a drain terminal coupled to the output node, and a back gate terminal coupled to a second terminal of the reference generator.

5. The circuit of claim 1, wherein the set of clock buffers comprises an even number of clock buffers.

6. The circuit of claim 1, wherein the set of clock buffers is fabricated using Fully Depleted Silicon On Insulator (FD-SOI) technology.

7. The circuit of claim 1, wherein the reference generator comprises:
a first portion that is integrated into a same first well as a first type of transistors of the set of clock buffers, wherein back gates of the first type of transistors are coupled to a terminal of the first portion of the reference generator; and
a second portion that is integrated into a same second well as a second type of transistors of the set of clock buffers, wherein back gates of the second type of transistors are coupled to a terminal of the second portion of the reference generator.

8. The circuit of claim 1, wherein the reference generator is programmable.

9. A circuit comprising:
a set of clock buffers; and
a reference generator to apply a voltage to a back gate of a transistor in the set of clock buffers, wherein the set of clock buffers and the reference generator are fabricated as having a same track height.

10. The circuit of claim 9, wherein the set of clock buffers and the reference generator are formed in a same well.

11. The circuit of claim 9, wherein the set of clock buffers comprises:
a first complementary transistor pair coupled between a first source node and a second source node, the first source node being coupled to a rail voltage and the second source node being coupled to a ground potential, the first complementary transistor pair comprising a first input terminal, a first output terminal, a first body well voltage terminal coupled to the reference generator, and a second body well voltage terminal coupled to the reference generator; and
a second complementary transistor pair coupled between the first source node and the second source node, the second complementary transistor pair comprising a second input terminal coupled to the first output terminal, a second output terminal, a third body well voltage terminal coupled to the reference generator, and a fourth body well voltage terminal coupled to the reference generator.

12. The circuit of claim 9, wherein the set of clock buffers comprises a first transistor comprising a front gate terminal coupled to an input node, a source terminal coupled to a first source node, a drain terminal coupled to an output node, and a back gate terminal coupled to the reference generator.

13. The circuit of claim 9, wherein the set of clock buffers comprises:
a first transistor comprising a front gate terminal coupled to an input node, a source terminal coupled to a first source node, a drain terminal coupled to an output node, and a back gate terminal coupled to a first terminal of the reference generator; and
a second transistor comprising a front gate terminal coupled to the input node, a source terminal coupled to a second source node, a drain terminal coupled to the output node, and a back gate terminal coupled to a second terminal of the reference generator.

14. The circuit of claim 9, wherein the set of clock buffers comprises an even number of clock buffers.

15. The circuit of claim 9, wherein the set of clock buffers is fabricated using Fully Depleted Silicon On Insulator (FD-SOI) technology.

16. A clock tree circuit comprising:
a set of clock buffers coupled in series between an input terminal and an output terminal, wherein a first clock buffer of the set comprises:
a first transistor comprising a front gate, coupled to the input terminal, and a back gate; and
a second transistor comprising a front gate, coupled to the input terminal, and a back gate, the first transistor and second transistor being coupled between a first source node and a second source node and having a first common output node; and
a reference generator to output a first voltage to the back gate of the first transistor to adjust a first threshold voltage of the first transistor and a second voltage to the back gate of the second transistor to adjust a second threshold voltage of the second transistor, wherein a first portion of the reference generator resides in a first well and a second portion of the reference generator resides in a second well.

17. The clock tree circuit of claim 16, wherein a second clock buffer of the set comprises:
a third transistor comprising a front gate, coupled to the first common output node, and a back gate; and
a fourth transistor comprising a front gate, coupled to the first common output node, and a back gate, the third transistor and fourth transistor being coupled between the first source node and the second source node and having a second common output node, wherein the reference generator to output the first voltage to the back gate of the third transistor to adjust a third threshold voltage of the third transistor and the second voltage to the back gate of the fourth transistor to adjust a fourth threshold voltage of the second transistor.

18. The clock tree circuit of claim 17, wherein the first transistor and the third transistor reside in the first well and the second transistor and the fourth transistor reside in the second well.

19. The clock tree circuit of claim 16, wherein the first transistor is a P-type transistor and the second transistor is an N-type transistor.

20. The clock tree circuit of claim 16, wherein the set of clock buffers is fabricated using Fully Depleted Silicon On Insulator (FD-SOI) technology.

21. A circuit comprising:
a process monitor;
a clock tree; and
a programmable reference generator coupled to the clock tree, wherein the process monitor is to measure a value indicative of a threshold voltage of at least one transistor of the clock tree, wherein the programmable reference generator is to adjust the threshold voltage of the at least one transistor based on the value by applying a voltage to a back gate of the at least one transistor, wherein the clock tree and the programmable reference generator are fabricated as having a same track height.

22. The circuit of claim 21, wherein the clock tree comprises a first complementary transistor pair comprising:
a first transistor comprising a front gate, coupled to an input terminal of the clock tree, and a back gate; and a second transistor comprising a front gate, coupled to the input terminal, and a back gate, the first transistor and second transistor being coupled between a first source node and a second source node and having a first common output node, wherein the programmable reference generator is to output a first voltage to the back gate of the first transistor to adjust a first threshold voltage of the first transistor and a second voltage to the back gate of the second transistor to adjust a second threshold voltage of the second transistor.

23. The circuit of claim 22, wherein the clock tree comprises a second complementary transistor pair comprising:
a third transistor comprising a front gate, coupled to the first common output node, and a back gate; and
a fourth transistor comprising a front gate, coupled to the first common output node, and a back gate, the third transistor and fourth transistor being coupled between the first source node and the second source node and having a second common output node, wherein the programmable reference generator is to output the first voltage to the back gate of the third transistor to adjust a third threshold voltage of the third transistor and to output the second voltage to the back gate of the fourth transistor to adjust a fourth threshold voltage of the second transistor.

24. The circuit of claim 23, wherein the first transistor is disposed on a first insulator buried oxide layer (BOX) region of a BOX layer, the second transistor is disposed on a second insulator BOX region of the BOX layer, the third transistor is disposed on a third insulator BOX region of the BOX layer, and the fourth transistor is disposed on a fourth insulator BOX region of the BOX layer.

* * * * *